(12) United States Patent
Collins et al.

(10) Patent No.: US 7,285,959 B1
(45) Date of Patent: Oct. 23, 2007

(54) BATTERY HOUSING AND BATTERY ANALYZER

(76) Inventors: Ralph C. Collins, 12649 N. 30th Dr., Phoenix, AZ (US) 85029; Greg N. Pierce, 1016 N. Palm, Gilbert, AZ (US) 85234

( * ) Notice: Subject to any disclaimer, the term of this patent is extended or adjusted under 35 U.S.C. 154(b) by 0 days.

(21) Appl. No.: 11/421,017

(22) Filed: May 30, 2006

(51) Int. Cl.
*G01N 27/416* (2006.01)
(52) U.S. Cl. ..................................... 324/426
(58) Field of Classification Search ............... 320/104, 320/107, 132, 149, 165, DIG. 18; 324/426, 324/427, 430; 340/636.1, 636.11, 636.12
See application file for complete search history.

(56) References Cited

U.S. PATENT DOCUMENTS 5,939,861 A * 8/1999 Joko et al. .................. 320/122
6,259,254 B1 * 7/2001 Klang ........................ 324/427

* cited by examiner

*Primary Examiner*—Edward H Tso
(74) *Attorney, Agent, or Firm*—H. Gordon Shields; Wayne Carroll

(57) ABSTRACT

An electrical source analyzer is claimed and disclosed with a circuit for a quick test of voltages using LEDs to indicate the voltage range, a circuit for measuring voltage using a meter with a display, a circuit for measuring current, as applied across a load with a display, and a circuit to indicate reverse polarity of the electrical source.

13 Claims, 1 Drawing Sheet

BATTERY HOUSING AND BATTERY ANALYZER

BACKGROUND OF THE INVENTION

1. Field of the Invention

This invention relates to the analysis of batteries, and more particularly to the analysis of a battery charging system and to the analysis of batteries charged by the battery charging system.

2. Description of the Prior Art

Commercial airliners have egress lighting systems powered by batteries, and the batteries are charged by a battery charging system in the airliners. Prior to the present invention, such batteries have been removed from the airliner periodically and analyzed to determine if they are properly charged and are replaced by charged batteries. The battery charging system of an airliner is referred to in the airline industry as a battery housing. In the following description both the term "battery housing" and "aircraft battery charging system" will be used.

The present invention provides a battery analyzer system which analyzes both the charging system of the aircraft on the aircraft and the batteries charged by the system by providing an initial indication of the status of both the battery housing and the batteries by analyzing both the voltage and amperage of the elements analyzed. A load is imposed by the present invention to provide amperage information.

BRIEF SUMMARY OF THE INVENTION

The invention described and claimed herein comprises an analyzer which is capable of testing multiple batteries together. The analyzer is also capable of testing an aircraft battery charging system to determine if it is working properly and capable of charging the batteries with correct voltage and amperage. The analyzer may test the charging system without a load to measure voltage. The analyzer may also test the charging system with a load connected, and measure both voltage and amperage. The analyzer may include simple LED indicators to show if the battery voltage is low, normal or high. The analyzer may also include a load. The load in the analyzer may be similar to the load of the circuit that the battery will be connected to. In this way a battery, under simulated load conditions, may be tested for voltage and amperage output. The analyzer may include meters and displays for either or both voltage and amperage. The analyzer may also include a circuit which indicates if the battery is connected to the analyzer with the wrong polarity.

Among the objects of the present invention are the following:

To provide an analyzer that tests multiple batteries in a fast and efficient manner;

To provide an analyzer for analyzing aircraft battery charging systems, that displays voltage and current under a load similar to actual use conditions;

To provide an analyzer for analyzing a battery that displays voltage and current under a load similar to actual use conditions To provide an analyzer that indicates reverse polarity of a connected battery or aircraft battery charging system;

To provide an analyzer that tests batteries and aircraft battery charging systems to ensure proper analysis of egress lighting system failures.

DETAILED DESCRIPTION OF THE INVENTION

Figure 1:
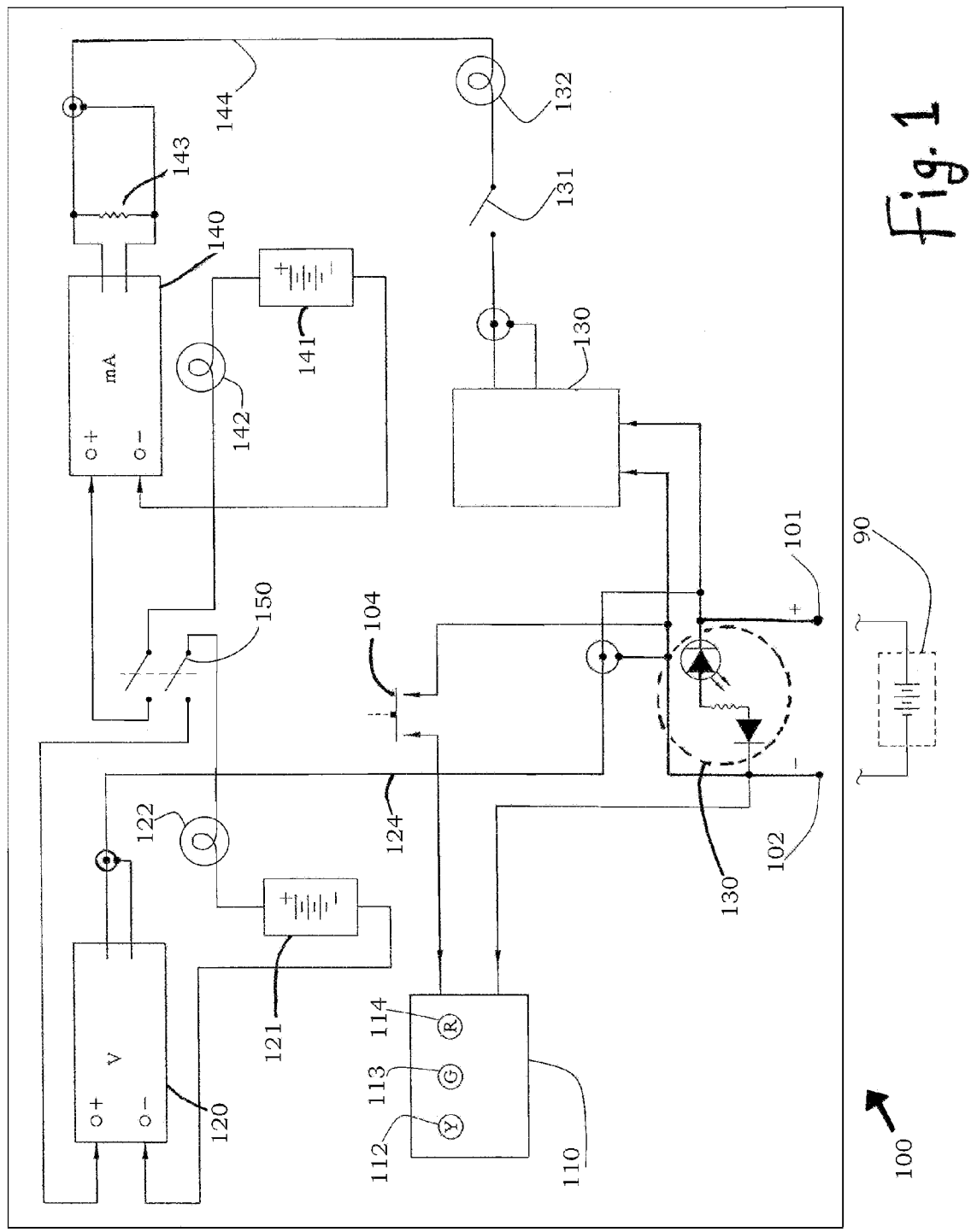
FIG. 1 is a block diagram of a battery housing analyzer.

FIG. 1 is the preferred embodiment of the invention, and will be discussed to illustrate the invention. The present invention is capable of testing an electrical source which may be a battery, or a power supply such as an aircraft battery charging system. Testing of a battery will be discussed first, followed by the testing of an aircraft battery charging system. FIG. 1 is a block diagram of a battery housing analyzer 100. An input battery 90 may be connected at the positive battery connector 101, and the negative battery connector 102. The preferred embodiment includes a reverse polarity circuit 103. If the input battery 90 is connected with the polarity reversed, then an LED will indicate reversed polarity. The reverse polarity circuit 103 may also include diodes to protect the battery housing analyzer 100 from damage resulting from reverse polarity.

According to the preferred embodiment a test switch or second switch 104 is used to connect the input battery 90 to a battery condition indicator circuit 110. When the input battery 90 is connected with reversed polarity the reverse polarity circuit 103 will function without the test switch 104 closed. In the preferred embodiment the test switch 104 is spring loaded to be in the off or open position when it is not pressed down. The test switch 104 may be omitted, and known switches other than a spring loaded switch may be used.

With the input battery 90 connected correctly the voltage may be tested. The preferred embodiment includes a LED voltage indicator circuit 110. The battery condition indicator circuit 110 may have multiple LEDs to indicate the voltage range of the input battery 90. In the preferred embodiment a yellow LED 112 may indicate a voltage range below the desired battery voltage range, a green LED 113 may indicate voltage within the desired voltage range, and a red LED 114 may indicate voltage above the desired voltage range. The battery condition indicator circuit 110 may contain more or less LEDs to indicate the voltage range and may be used to make a quick determination of the battery status.

In addition to the battery condition indicator circuit 110, the preferred embodiment includes a voltage meter circuit 120. The voltage meter circuit 120 may be set to a range sufficient to measure the voltage of the input battery 90 connected to the battery connectors 101 and 102. The battery connectors 101 and 102 are connected to the voltage meter circuit 120 through a conductor 124. For simplicity in the drawing, FIG. 1 shows only one conductor 124 which represents a conductive connector from the positive and negative terminals of the input battery 90, to the voltage meter circuit. In the preferred embodiment the voltage meter circuit 120 has a display using a liquid crystal display (LCD). The voltage meter circuit 120 may be powered by a battery 121, and may have an indicator 122 to indicate that the voltage meter circuit is powered on. The indicators in this circuit may be a lamp, an LED or other visual or audio indicator. The voltage meter circuit 120 may be powered by power sources other than a battery. A power switch or first switch 150 may be used to electrically connect the battery 121 to the voltage meter circuit 120.

According to the preferred embodiment of the invention, the battery housing analyzer may have a load bank 130. The load bank 130 may be a load which has the same characteristics as the aircraft egress lighting system, which is connected to a battery in normal operation. In this way the load bank 130 will provide a proper measurement for the testing of the battery amperage output. The load bank 130 may have a load switch or third switch 131 to connect the load to an amperage meter circuit 140. The load switch may also be connected to a load indicator 132 to indicate that the load switch is on and the input battery is connected to the load. The input battery 90 connected to connectors 101 and 102 is connected to the amperage meter circuit 140 through a conductor 144. For simplicity in the drawing, FIG. 1 shows only one conductor 144 which represents conductive connectors for the positive and negative conductors in the circuit, from the load bank 130 to the amperage meter circuit 140.

According to the preferred embodiment the amperage meter circuit 140 is powered by a battery 141 and is connected to an indicator 142 to indicate that the amperage meter circuit is powered. The input to the amperage meter circuit 140 may be connected across a current viewing resistor (CVR) 143. The range of the amperage meter circuit may be set to a range sufficient to measure the amperage output of the battery connected at the connectors 101 and 102. The power switch 150 may be used to connect the battery 141 to the amperage meter circuit 140. The power switch 150 may be two separate switches, one for the voltage meter circuit 120, and one for the amperage meter circuit 140. The power switch 150 may also be a double pole, double throw switch. The power switch may also be a double pole, single throw switch.

According to the preferred embodiment shown in FIG. 1 the analyzer 100 may be used without external power sources. The internal batteries 121 and 141 provide power to the meters 120 and 140. A battery 90 to be analyzed may be connected at the connectors 101 and 102 may provide power for the reverse polarity circuit 103 and the battery condition indicator circuit 110. With no external power required other than the battery 90 to be tested, the battery housing analyzer 100 may be used in a remote location such as in an aircraft. The battery 90 may be disconnected from the usual application and connected to the battery housing analyzer 100.

An example is a battery 90 that is used to power emergency egress lighting on an aircraft. The battery 90 may be disconnected from the emergency egress lighting and connected to the battery housing analyzer 100 without removing the battery from the aircraft. This method of testing a battery, or group of batteries, saves considerable time as the batteries do not need to be removed from the aircraft in order to be tested.

The battery housing analyzer 100 may be used to test an aircraft battery charging system. The aircraft battery charging system may be connected in the same manner as a battery 90. The aircraft battery charging system may also be connected in series with a battery to test the aircraft battery charging system. The voltage meter circuit 120 may have a range which will allow the testing of the aircraft battery charging system. The voltage of the aircraft battery charging system may be tested with the load bank 130 connected, or without the load bank connected.

Some batteries have the characteristic of low resistance when they are fully discharged, and high resistance when they are fully charged. As the battery housing analyzer 100 tests the aircraft battery charging system it is desirable to test conditions similar to the different conditions of a battery. When the load switch 131 is connected or closed, the battery housing analyzer may test the aircraft battery charging system in a condition similar to when a fully charged battery is connected to the aircraft battery charging system, testing both voltage and amperage output. When the load switch 131 is open, a condition similar to a fully discharged battery may be tested.

It is necessary to test the aircraft battery charging system both with and without a load. The aircraft battery charging system may show voltage sufficient to charge a battery when the battery is fully discharged, but may not work property in charging the batteries that are near a full condition. If this is the case, the batteries on the aircraft will not fully charge and the lighting systems will not work in the event of an emergency when they are needed. If the aircraft battery charging system is not tested, but batteries are tested and show a low voltage, then the batteries might be replaced without identifying the true problem. The present invention enables a simple system for testing both the battery and the aircraft battery charging system to quickly identify and address problems with the aircraft egress lighting system. In the preferred embodiment the battery housing analyzer 100 is small enough to be carried onto a plane. The battery housing analyzer may also be large and used in a testing facility outside the aircraft. The battery housing analyzer may also be incorporated with a battery charging system.

The battery housing analyzer may be used to test an electrical source. The electrical source may be a battery, or it may be a battery charging circuit. The battery housing analyzer may also be used to test a battery charging circuit when connected to a battery.

While the principles of the invention have been made clear in illustrative embodiments, there will be immediately obvious to those skilled in the art many modifications of structure, arrangement, proportions, and methods, the elements, materials, and components used in the practice of the invention, and otherwise, which are particularly adapted to specific environments and operative requirements without departing from those principles. The appended claims are intended to cover and embrace any and all such modifications, within the limits only of the true spirit and scope of the invention.

What is claimed is:

1. Apparatus for analyzing an aircraft charging system for charging egress lighting batteries and for analyzing an aircraft egress lighting battery charged by the charging system comprising in combination:
   a first display element for displaying a first analysis;
   a first battery for providing current for the first display element;
   a second display element for displaying a second analysis;
   a second battery for providing current for the second display element
   a pair of input connectors for connecting the aircraft battery charging system to the first and second display elements when the charging system is being analyzed, and when the aircraft egress lighting battery charged by the charging system is being analyzed for connecting the egress lighting battery to the first display and second display elements;
   a first switch for selectively connecting and disconnecting the first and second batteries to their respective first and second display elements.

2. The apparatus of claim 1 which further includes a second switch for connecting the input connectors to the means for providing and initial indication of the condition of the charging system being analyzed, and the initial indication of the condition of the egress lighting battery being analyzed.

3. The apparatus of claim 2 which further includes means for providing an initial indication of the condition of the battery charging system and an initial indication of the condition of egress lighting battery charged by the battery charging system.

4. The apparatus of claim 3 in which the means for providing an initial indication of the condition of the charging system being analyzed and the initial condition of the battery being analyzed comprises a plurality of lights.

5. The apparatus of claim 4 in which the plurality of lights includes one color for indication of a low output condition, another color for indicating a normal output condition, and another color for indicating a high output condition.

6. The apparatus of claim 5 in which the plurality of lights includes light emitting diodes.

7. The apparatus of claim 2 which further includes a third switch having a first position for connecting the first display element to the aircraft battery charging system and having a second position for connecting the aircraft battery charging system to the first and second display elements when the aircraft battery charging system is being analyzed, and when a battery charged by the charging system is being analyzed for connecting the battery being analyzed to the first display element when the third switch is in the first position and for connecting the first and second display elements to the battery being analyzed when the third switch is in the second position.

8. The apparatus of claim 7 which further includes a load bank connected to the charging circuit being analyzed for providing a load between the charging system being analyzed and the second display element, and when the egress lighting battery charged by the charging system is being analyzed for providing a load between the egress lighting battery and the second display element.

9. The apparatus of claim 8 which further include a current viewing resistor between the second display element and the load bank.

10. The apparatus of claim 9 in which the first display element displays voltage.

11. The apparatus of claim 10 in which the second display element display amperage.

12. The apparatus of claim 1 which further includes means for detecting and indicating a reverse polarity of the charging system being analyzed connected to the pair of input connectors, and of the battery charged by the battery charging system connected to the pair of input connectors when the battery is being analyzed.

13. The apparatus of claim 12 in which the means for detecting and indicating reverse polarity includes a light emitting diode.

* * * * *